United States Patent [19]

Wakamatsu et al.

[11] Patent Number: 5,321,363

[45] Date of Patent: Jun. 14, 1994

[54] TWO-TERMINAL CIRCUIT ELEMENT MEASURING APPARATUS FOR PERFORMING CONTACT CHECKS

[75] Inventors: Hideki Wakamatsu; Nobuo Nakata; Yohichi Kuboyama; Hideshi Tanaka, all of Kobeshi, Japan

[73] Assignee: Hewlett-Packard Company, Palo Alto, Calif.

[21] Appl. No.: 1,851

[22] Filed: Jan. 8, 1993

Related U.S. Application Data

[63] Continuation-in-part of Ser. No. 951,657, Sep. 25, 1992, abandoned.

[30] Foreign Application Priority Data

Sep. 26, 1991 [JP] Japan .................. 3-274817

[51] Int. Cl.⁵ .......................................... G01R 31/08
[52] U.S. Cl. ........................... 324/523; 324/158 P; 324/540
[58] Field of Search ............... 324/158 P, 522, 523, 324/540, 555, 609, 611, 713, 714, 715, 719; 307/270

[56] References Cited

U.S. PATENT DOCUMENTS

| | | | |
|---|---|---|---|
| 4,440,985 | 4/1984 | Federico et al. | 324/522 X |
| 4,795,962 | 1/1989 | Yanagawa et al. | 324/611 |
| 5,014,012 | 5/1991 | Kuboyama et al. | 324/720 |

FOREIGN PATENT DOCUMENTS 1-180776 12/1989 Japan .

OTHER PUBLICATIONS

SMO851–Ultra-high Resistance Tester for Automatic Inspection–TOA Electronics Ltd., five pages, Sep. 1988.
Model 4329A High Resistance Meter–Operating and Service Manual–Aug., 1974, Hewlett Packard.
Model 4328A Milliohmmeter–Operating and Service Manual Jan. 1982, Hewlett Packard.

*Primary Examiner*—Kenneth A. Wieder
*Assistant Examiner*—Christopher M. Tobin
*Attorney, Agent, or Firm*—Woodcock Washburn Kurtz Mackiewicz & Norris

[57] ABSTRACT

A two-terminal circuit element measuring apparatus of the present invention is capable of distinguishing a loose connection between a DUT and the measuring apparatus from a high impedance in the DUT. The measuring apparatus is also capable of measuring the impedance of the DUT without altering the connections between the DUT and the measuring apparatus. The measuring apparatus applies both DC and AC current signals to the DUT so as to compensate any leakage current occurring within the three-wire cable connecting the DUT and the measuring apparatus. Because of the compensation, when both DC and AC current ammeters indicate substantially zero values, it is assured that a loose connection exists.

14 Claims, 5 Drawing Sheets

———•⁀⁀⁀⁀— FIRST CONDUCTOR
———•⁀⁀⁀⁀— SECOND CONDUCTOR
———•⁀⁀⁀⁀— DRIVE WINDING

TWO-TERMINAL CIRCUIT ELEMENT MEASURING APPARATUS FOR PERFORMING CONTACT CHECKS

This is a continuation-in-part of application Ser. No. 07/951,657, filed Sep. 25, 1992, now abandoned. The disclosure of that document is expressly incorporated herein.

FIELD OF THE INVENTION

The present invention generally relates to a two-terminal circuit element measuring apparatus for performing a contact check function, and more specifically, to such apparatus also capable of checking the insulation resistance of a sample (i.e., an object to be measured) at the same time as a contact check, and capable of measuring the capacitance of this sample without any connection change in the cables.

BACKGROUND OF THE INVENTION

A typical use of an insulation resistance tester is to test the insulation resistance of a capacitor. In an insulation resistance test, a good sample has a high insulation resistance value. However, a problem with conventional insulation resistance measuring apparatus is that such a contact check cannot be performed on the basis of measuring the insulation resistance value. In other words, if there is a loose contact between the tester device and a sample which has insufficient insulation, the tester may indicate that the sample has sufficient insulation. This problem becomes apparent in an automatic inspection process.

When a capacitor is used as a sample, since the capacitor represents a low impedance to an AC signal, the insulation resistance of the capacitor is measured by using a DC signal, while the high-frequency impedance thereof is measured by using an AC signal. On the basis of these measurements, it can be determined whether the measurement of the insulation resistance is valid, namely whether the contact is valid.

In general, an insulation resistance tester, as shown in FIG. 1, comprises a measuring device main frame 1 and an extension cable 5. The main frame 1 further comprises a shielded outer sheath 11 and a DC ammeter 12 having one input terminal connected to the shielded outer sheath 11, and a DC voltage source 13 for applying a DC high voltage between the outer sheath 11 and a ground. The extension cable 5 further comprises a first conductor 31 constituting a center conductor; a second conductor 32 for covering the first conductor, and a third conductor 33 for covering the second conductor 32. At one end of the above-described cable 5, the first conductor 31 is connected to the other input terminal of the DC ammeter 12, and the second conductor 32 is connected to the outer sheath 11. The third conductor 33 is grounded. A sample 6, shown as a parallel circuit comprising a capacitor C and a resistor $R_{DC}$, is connected to the sample connecting terminals of the first and third conductors, 31 and 33, at the other end of the cable 5.

In an automatic inspection process, an impedance measurement is taken in conjunction with the above-described contact check in order to determine whether a sample demonstrates a predetermined characteristic. When there is a long distance between the sample 6 (namely, an object to be measured; the sample or object to be measured will be hereinafter referred to as a "DUT") and a measuring apparatus, the cable 5 from the measuring terminal is extended to, for instance, 1 to 2 meters for the impedance measurement. Also, in this setting, such a measurement must be taken while one of the input lines to the DUT is grounded. The following conditions are required for a successful measurement in the above described setting:

(1) An increase in capacitance should be detected when a DUT is connected to the measuring apparatus, even with an extended cable.

(2) A measurement of such a DUT should be taken with an AC grounded lead wire.

(3) The current path to measure a DC resistance is not adversely influenced by external electromagnetic fields and the like. Furthermore, conversely, this current path does not have any electromagnetic influence on an external device.

(4) An additional cable to measure impedance is not required.

Although the conventional impedance measuring apparatus, such as HP4192A: LF Tmpedance Analyzer sold by Hewlett Packard Co. in the U.S.A., can satisfy condition (1), such conventional measuring apparatus has the following problems: It is impossible to connect a DUT with one grounded lead wire in the measuring circuit with a high impedance because one of two lead wires of the DUT is driven by a measurement signal source and the other is virtually grounded through a current measuring device. Thus, the above-described condition (2) cannot be satisfied. When a ground terminal of a DUT is not grounded, an adverse influence over a measurement caused by an external electromagnetic field becomes conspicuous. This may considerable deteriorate a precision measurement so that the above-described condition (3) cannot be satisfied. In addition, while the insulation tester handles high DC voltage (1000 volts) and low DC current (less than pico amperes), the impedance meter handles AC voltage and current in a 10 Hz to 1 MHz range. These different operations make it difficult to combine the insulation tester and impedance meter.

The present invention has been proposed to solve the above-described problems. An object of the invention is to provide a two-terminal circuit element measuring apparatus for performing a contact check function for sensing a loose contact at a terminal so as to allow a high precision measurement by a single apparatus. A related object is to provide apparatus for measuring the impedance of a DUT with a high precision in connection with an automatic component feeding apparatus.

SUMMARY OF THE INVENTION

A measuring apparatus according to one embodiment of the present invention with a body and a three-wire cable having a first conductor, a second conductor and a third conductor may include a DC voltage signal source located in the body and being connected to the first conductor and the third conductor and to the second conductor and the third conductor for applying a DC signal to the object to be measured; an AC voltage signal source located in the body for applying an AC signal to the object to be measured so as to modulate the DC signal; an AC voltage measuring device located in the body and being connected between the first conductor and the third conductor and between the second conductor and the third conductor for measuring the AC voltage applied to the object to be measured by the AC voltage signal source; a DC current measuring device located in the body and being connected between the first conductor and the second conductor for measuring the DC current supplied to the object to be measured by said DC voltage signal source; and an AC current measuring device located in the body and being connected between the first conductor and second conductor for measuring the AC current supplied to the object to be measured by the AC voltage signal source.

According to another aspect of the present invention, a method of distinguishing a loose connection between a DUT and a measuring apparatus from a high impedance in the DUT may include the steps of (1) applying an AC signal to the DUT through a three-wire coaxial cable; (2) applying a DC signal so as to compensate for a leakage current occurring within the three-wire coaxial; (3) measuring the AC current flowing through the DUT; (4) measuring the DC current flowing through said DUT; and (5) determining whether a loose connection between the DUT and the measuring apparatus exists based upon the measurement values taken in Steps (3) and (4).

DETAILED DESCRIPTION OF THE PREFERRED EMBODIMENTS

Figure 1:
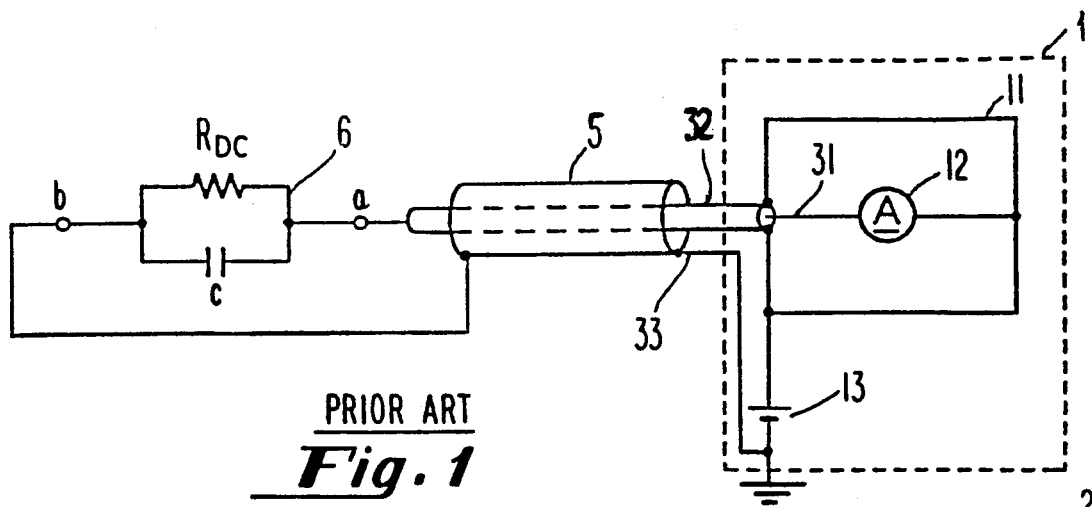
FIG. 1 is a schematic circuit diagram of a conventional insulation resistance meter.
Figure 2:
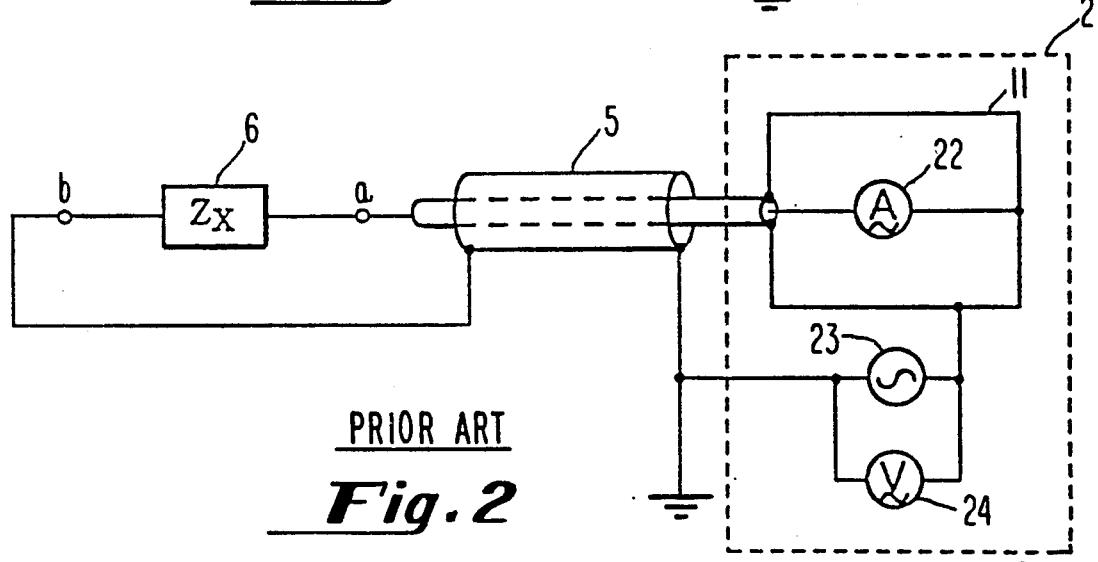
FIG. 2 is a schematic circuit diagram of a one-terminal trio measuring apparatus for high impedance.

A one-terminal trio measuring apparatus of the current invention has the priority date of the Japanese application No. 03-274543 which was filed on Sep. 26, 1991, and is used to measure a DUT with a high impedance. Such apparatus comprises a measuring apparatus main frame 2 and a three-wire coaxial cable 5, as shown in FIG. 2. The measuring apparatus main frame 2 further comprises an AC ammeter 22 corresponding to the DC ammeter 12 shown in FIG. 1, a AC voltage source 23 corresponding to the DC voltage source 13 shown in FIG. 1 and an AC voltmeter 24. The measuring apparatus main frame 2 is analogous to its DC counterpart main frame 1 of the above-described prior art insulation resistance tester. An impedance "Zx" 6 is connected to the cable 5. If the insulation resistance meter of FIG. 1 could be combined with the one-terminal trio measuring apparatus of FIG. 2 without causing any interference, the above-described objects would be achieved. This invention achieves such a desired combination.

Figure 3:
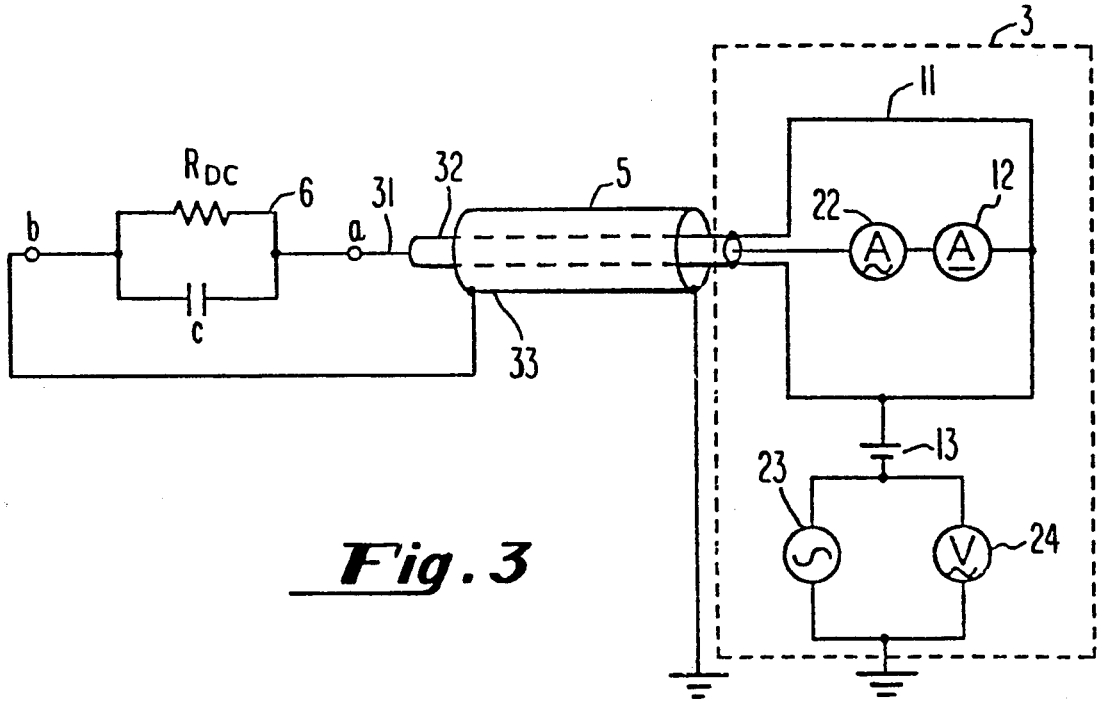
FIG. 3 is a schematic circuit diagram illustrating a preferred embodiment of the apparatus according to the present invention, illustrating the measuring principle of the invention.

Accordingly, FIG. 3 depicts a preferred embodiment of the present invention. One end of a three-wire coaxial cable 5 is connected to the main frame 3 of the measuring apparatus, and a DUT 6 including a capacitance C and a resistor RDC in parallel are connected between the first conductor 31 and the third conductor 33 at the other end of the cable 5. A series connection of the ammeter 12 of FIG. 1 and the ammeter 22 of FIG. 2 corresponds to these ammeters 12 and 23 in FIG. 3. Similarly, a AC voltage source 23 and an AC voltmeter 24 of FIG. 2 are combined in parallel and have a series connection with DC voltage source 13, also as seen in FIG. 3. In FIG. 3, DC ammeter 12, AC ammeter 22, AC voltmeter 24, DC voltage source 13, and AC voltage source 23, respectively, correspond to the DC and AC current measuring devices, the AC voltage measuring device, and the DC and AC voltage signal sources, according to the present invention.

In the circuit of FIG. 3, a DC current is supplied from the DC voltage source 13 to the DUT 6, and this DC current is detected by the ammeter 12. Also, an AC current is supplied from the AC voltage source 23 to the DUT 6. AC current is measured by the ammeter 22, and the AC response voltage of the DUT 6 is measured by a voltmeter 24.

An ideal open state can be obtained. An ideal state is achieved by eliminating any leakage current from the first conductor to the second or third grounded conductor. Since a leakage current from the first ungrounded conductor is prevented by applying the same potential as the first conductor to the second conductor, the value measured by the AC ammeter 22 is adjusted to zero in the apparatus of the present invention. Thus, when the values measured by the DC ammeter 12 and AC ammeter 22 are essentially zero, a loose connection (contact) of the DUT can be assuredly detected under the ideal open state. However, when the value measured by the DC ammeter 12 is essentially zero and the value measured by the AC ammeter 22 is not essentially zero under the ideal open state, the connection of the DUT is normal. This is because the AC ammeter 22 is not reading any leakage current, as the leakage current is compensated by the DC voltage applied from the DC voltage source 13. The impedance of this DUT 6 (essentially, the capacitance of the capacitor C) is measured based upon the values measured by AC ammeter 22 and DC ammeter 12.

It should be noted that the conventional measuring apparatus cannot obtain the above-described ideal open condition. When a loose connection of the DUT 6 happens to occur, no current flows through the DUT 6. Although the value measured by the DC ammeter 12 becomes zero, the value of the AC ammeter 22 does not always become zero. Since the leakage current is not compensated, the AC ammeter 22 may be reading the uncompensated leak current from the first conductor 31 despite the loose connection. Accordingly, discrimination cannot be made whether the connection is actually loose, or the DUT 6 has a high impedance.

Figures 4A, 4B:
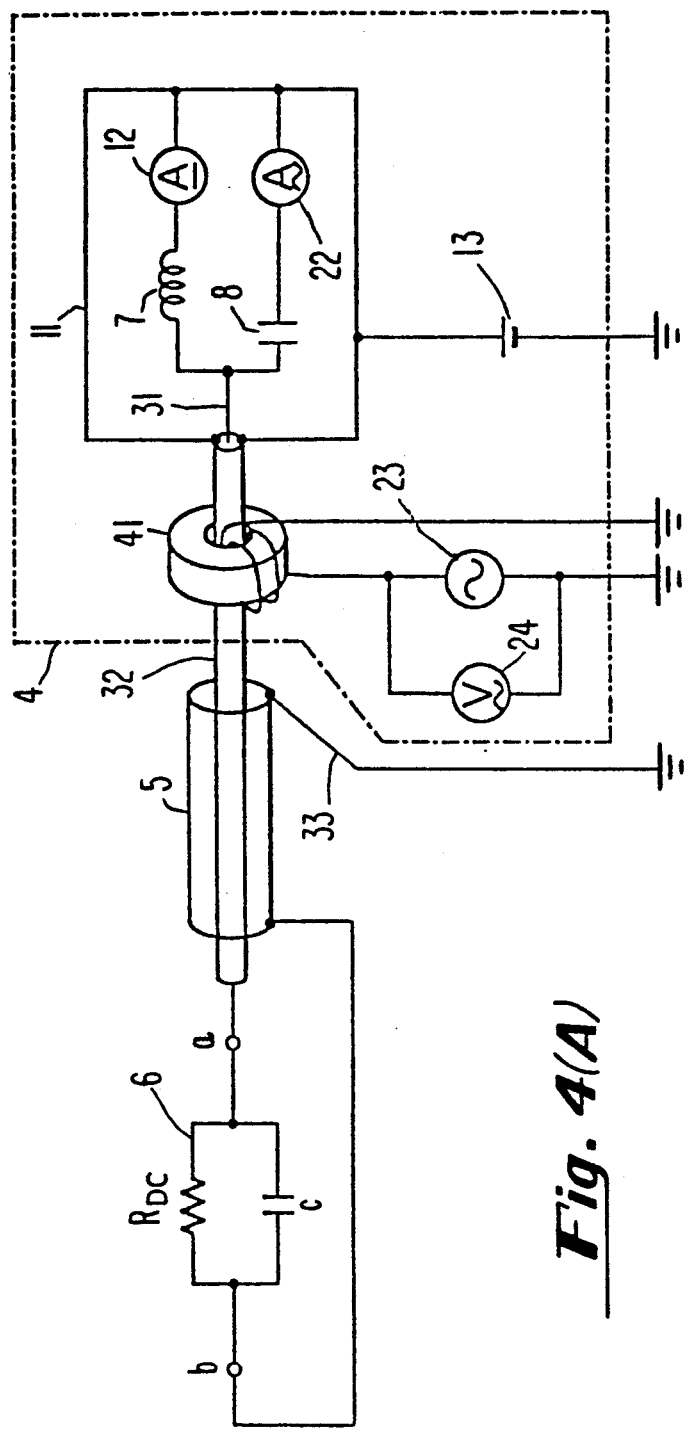
FIG. 4(A) is a schematic circuit diagram of a first alternative embodiment based upon the circuit shown in FIG. 3.
FIG. 4(B) is an equivalent circuit diagram of a ferrite core transformer shown in FIG. 4(A).

Another embodiment of a measuring apparatus according to the present invention will now be explained with reference to FIGS. 4(A) and 4(B). In FIG. 4(A), one end of the three-wire coaxial cable 5 is connected to a main frame 4 of the measuring apparatus. The other ends of the first conductor 31 and the third grounded conductor 33 of the cable 5 respectively are connected to DUT measuring terminals "a" and "b." In other words, a DUT (indicated by a parallel circuit of capacitor C and an insulation resistor $R_{DC}$) is connected between these DUT measuring terminals "a" and "b."

A ferrite core transformer 41 is disposed over the first and second conductors, 31 and 32 of the three-wire coaxial cable 5. One end of a drive winding wound on this transformer 41 is connected through AC voltage source 23 to ground, and the other end thereof is connected via ground to the third conductor 33 of the cable 5. It should be understood that in this embodiment transformer 41 and the AC voltage source 23 constitute the AC voltage signal source according the present invention. By using the transformer 41, the voltage sources 13 and 23 which generate electromagnetic energy, are mutually separated and grounded. Then, there is little interference between the environment and the tester. The DC voltage source 13 usually includes a high frequency oscillator to generate a high DC voltage. In addition, the parallel connection of current measuring devices 12 and 22 is more desirable than a series connection as the former provides better mutual isolation. The best mode is that cable 32 is wound on the core 41 in three turns and a wire driven by voltage source 23 at 400 kHZ is wound on the core for 10 turns.

An AC voltage measuring device (i.e., AC voltmeter 24 in FIG. 4A) is connected parallel to the above described AC voltage source 23, and measures the AC voltage applied by the AC voltage source 23 via the transformer 41 to the DUT 6. In FIG. 4(B), an equivalent circuit of the transformer 41 comprises the first conductor, the second conductor, and the drive winding constituting a three-winding transformer. Since the first conductor and the second conductor are driven simultaneously by the transformer 41, it is not required to employ a circuit floating separately from a ground. If the frequency of the AC voltage source 23 is set at several hundred kHz or more, a compact transformer having an energizing impedance of several tens of ohms may be constructed by merely winding the coaxial cable by 1 to 3 turns.

A DC voltage source 13 of FIG. 4A is connected between the first and second conductors 31 and 32 of the cable 5 and the above-described third conductor 33. Similarly, a parallel circuit of a DC current measuring device and an AC current measuring device is connected between first and second conductors 31 and 32. The DC current measuring device is a series connection of an inductor 7 and a small-current DC ammeter 12, while the AC current measuring device is a series connection of a capacitor 8 and an AC ammeter 22. It is noted that the inductance of the inductor 7 is set to provide a sufficiently greater impedance than the impedance of the measuring circuit at the measuring frequency, and the capacitance of the capacitor 8 is set to provide a sufficiently smaller impedance than the impedance of the measuring circuit.

The operation of the measuring apparatus shown in FIG. 4(A) will now be explained. An AC voltage having a predetermined frequency is applied from the AC voltage source 23 via the ferrite core transformer 41 to the measuring terminals "a" and "b." A DC voltage is also applied from the DC voltage source 13 thereto. Thus, a superposition of the DC voltage and the AC voltage is applied between the terminals "a" and "b."

When the value of AC current measured by the AC ammeter 22 is non-zero, it is determined that the connection between the terminals "a" and "b" and the DUT 6 is normal. This measured value is compensated for the leakage current from the first conductor 31. Then, a determination is made whether the DUT 6 is acceptable based upon the measured value of the DC ammeter 12. Thus, the smaller this measured DC value, the better the DUT 6. The impedance of the DUT 6 is also determined from the measured values of the AC voltmeter 24 and the AC ammeter 22.

On the other hand, when both of the measured values of the DC ammeter 12 and the AC ammeter 22 are substantially 0, it is determined that a contact of the measuring terminals "a" and "b" is abnormal. Since the leakage current is compensated, a zero value reflects a loose connection in the circuit. To ascertain accuracy, the check and measurement may be repeated for the particular DUT 6.

Figure 5:
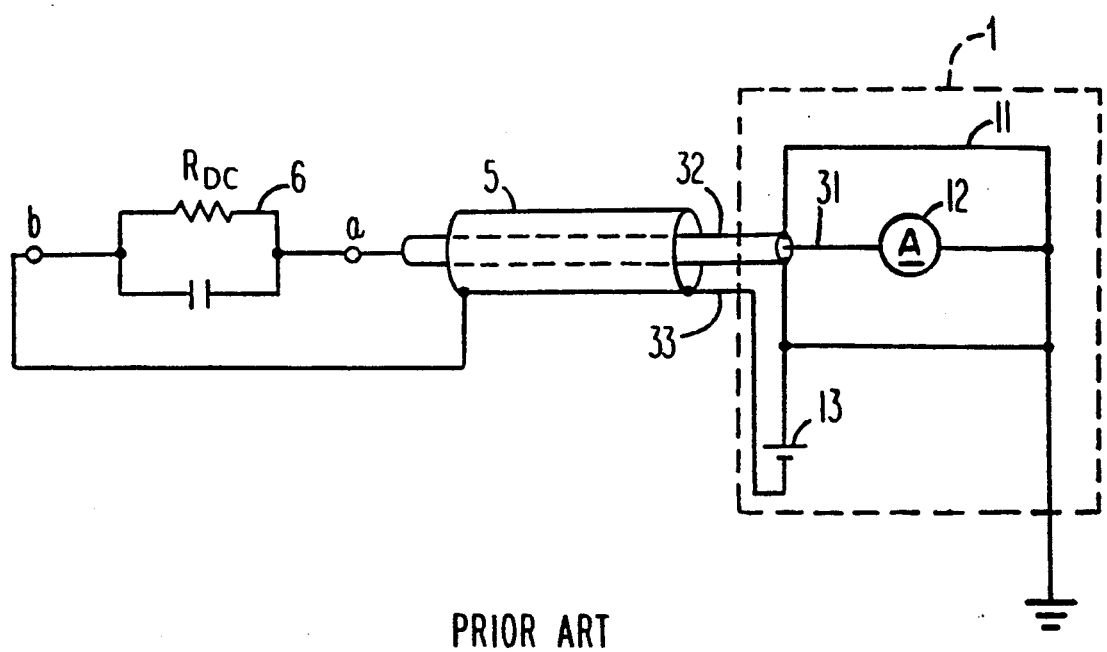
FIG. 5 is a schematic circuit diagram of another conventional insulation resistance meter based upon the circuit shown in FIG. 1.

FIG. 5 schematically depicts another conventional insulation resistance meter which comprises an extension cable 5 and a measuring device main frame 1. The extension cable 5 further comprises a first conductor 31 constituting a center conductor; a second conductor 32 for covering the first conductor, and a third conductor 33 for covering the second conductor 32. The main frame 1 further comprises a shielded outer sheath 11 and a DC ammeter 12 having one input terminal connected to the grounded outer sheath 11 for shielding, and a DC voltage source 13 for applying a DC high voltage between the outer grounded sheath 11 and the third conductor 33. At one end of the above-described cable 5, the first conductor 31 is connected to the other input terminal of the DC ammeter 12 and in turn grounded, and the second conductor 32 is connected to the outer sheath 11 and in turn grounded. The third conductor 33 is connected to the DC voltage source 13. A sample DUT 6, shown as a parallel circuit comprising a capacitor C and a resistor $R_{DC}$, is connected to the sample connecting terminals of the first and third conductors, 31 and 33, at the other end of the cable 5.

Figure 6:
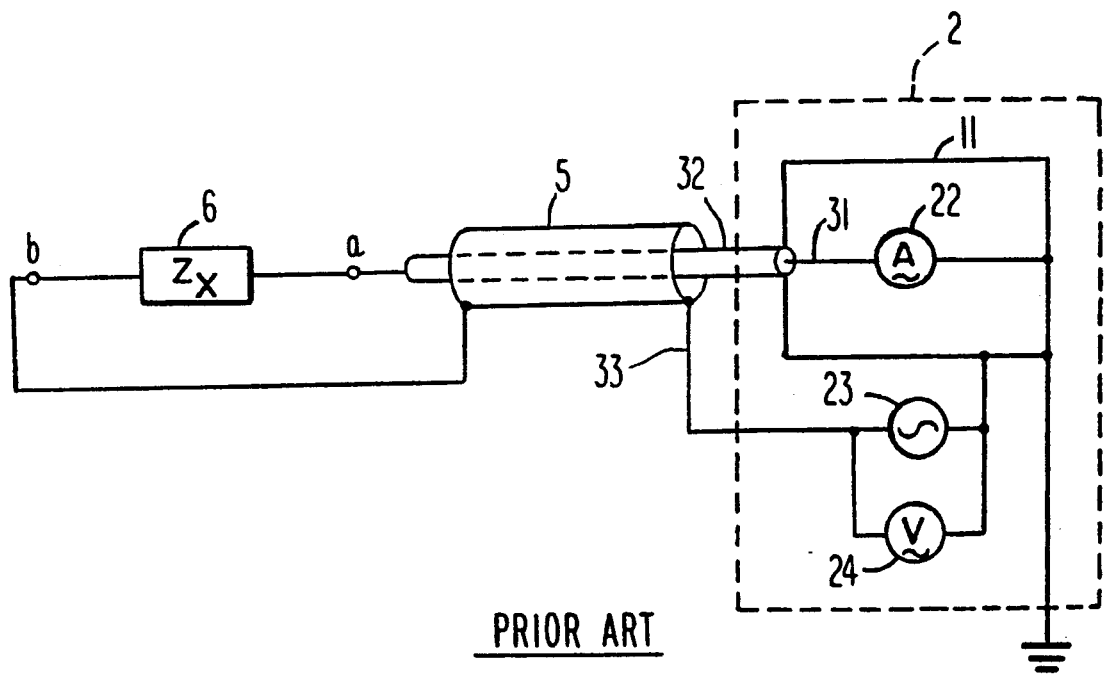
FIG. 6 is a schematic circuit diagram of another conventional insulation resistance meter based upon the one-terminal trio measuring apparatus for high impedance as shown in FIG. 2.

FIG. 6 is yet another conventional insulation resistance measuring device which is similar to the apparatus shown in FIG. 2. The measuring apparatus main frame 2 further comprises an AC ammeter 22 corresponding to the DC ammeter 12 as shown in FIG. 5, a AC voltage source 23 corresponding to the DC voltage source 13 as shown in FIG. 5 and an AC voltmeter 24 across the AC voltage source 23. The measuring apparatus main frame 2 is analogous to its DC counterpart main frame 1 of the above-described prior-art resistance meter. At one end of the above-described cable 5, the first conductor 31 is connected to one input terminal of the AC ammeter 22. The other input terminal of the AC ammeter 22 is grounded. The second conductor 32 is connected to the outer sheath 11 and in turn grounded. The third conductor 33 is connected to the AC voltage source 23. An impedance "Zx" 6 is connected to the cable 5 at the other end.

Figure 7:
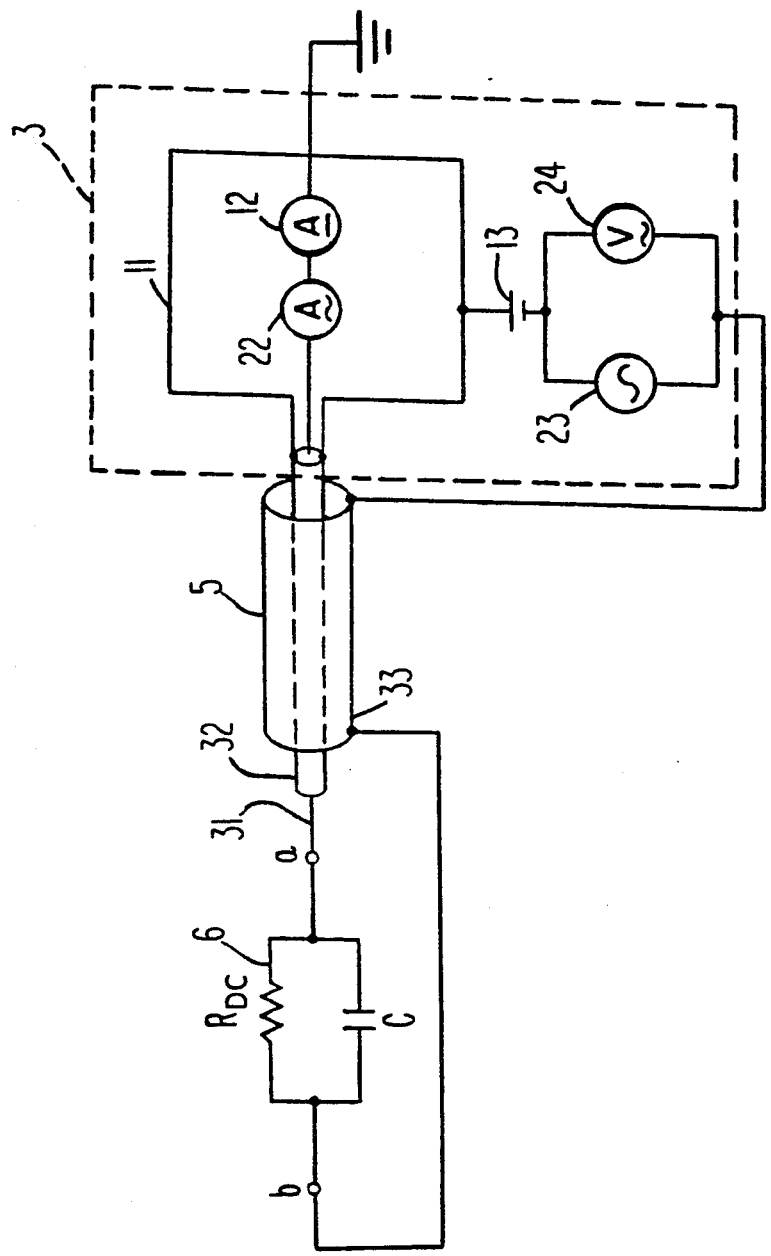
FIG. 7 is a schematic circuit diagram illustrating a third alternative embodiment of the apparatus according to the present invention, illustrating the measuring principle of the invention.

FIG. 7 depicts a third preferred embodiment of the present invention. One end of a three-wire coaxial cable 5 is connected to the main frame 3 of the measuring apparatus, and a DUT 6 including a capacitance C and a resistor RDC in parallel are connected between the first conductor 31 and the third conductor 33 at the other end of the cable 5. A series connection of the ammeter 12 of FIG. 5 and the ammeter 22 of FIG. 6 corresponds to these ammeters 12 and 22 in FIG. 7. Similarly, an AC voltage source 23 and an AC voltmeter 24 of FIG. 6 are combined in parallel and have a series connection with DC voltage source 13, also as seen in FIG. 7. One end of the DC ammeter 12 is grounded via the outer sheath 11. The third conductor 33, on the other hand, is connected to one end of AC voltage source 23 and AC voltmeter 24 rather than grounded as shown in FIG. 3. In FIG. 7, DC ammeter 12, AC ammeter 22, AC voltmeter 24, DC voltage source 13, and AC voltage source 23, respectively, correspond to the DC and AC current measuring devices, the AC voltage measuring device, and the DC and AC voltage signal sources of FIGS. 5 and 6, according to the present invention.

An ideal open state can be obtained in the apparatus as shown in FIG. 7 in the same manner as in FIG. 3. An ideal state is achieved by eliminating any leakage current from the first conductor to the second or third conductor as described in reference to FIG. 3 by applying the same potential as the first conductor to the second conductor. A DC current is supplied from the DC voltage source 13 to the DUT 6, and this DC current is detected by the ammeter 12. Also, an AC current is supplied from the AC voltage source 23 to the DUT 6. AC current is measured by the ammeter 22, and the AC response voltage of the DUT 6 is measured by a voltmeter 24. Thus, as described in reference to FIG. 3, only when the values measured by the DC ammeter 12 and AC ammeter 22 are essentially zero, a loose connection of the DUT can be assuredly detected under the ideal open state. The impedance of this DUT 6 is also measured based upon the values measured by AC ammeter 22 and DC ammeter 12.

Figure 8:
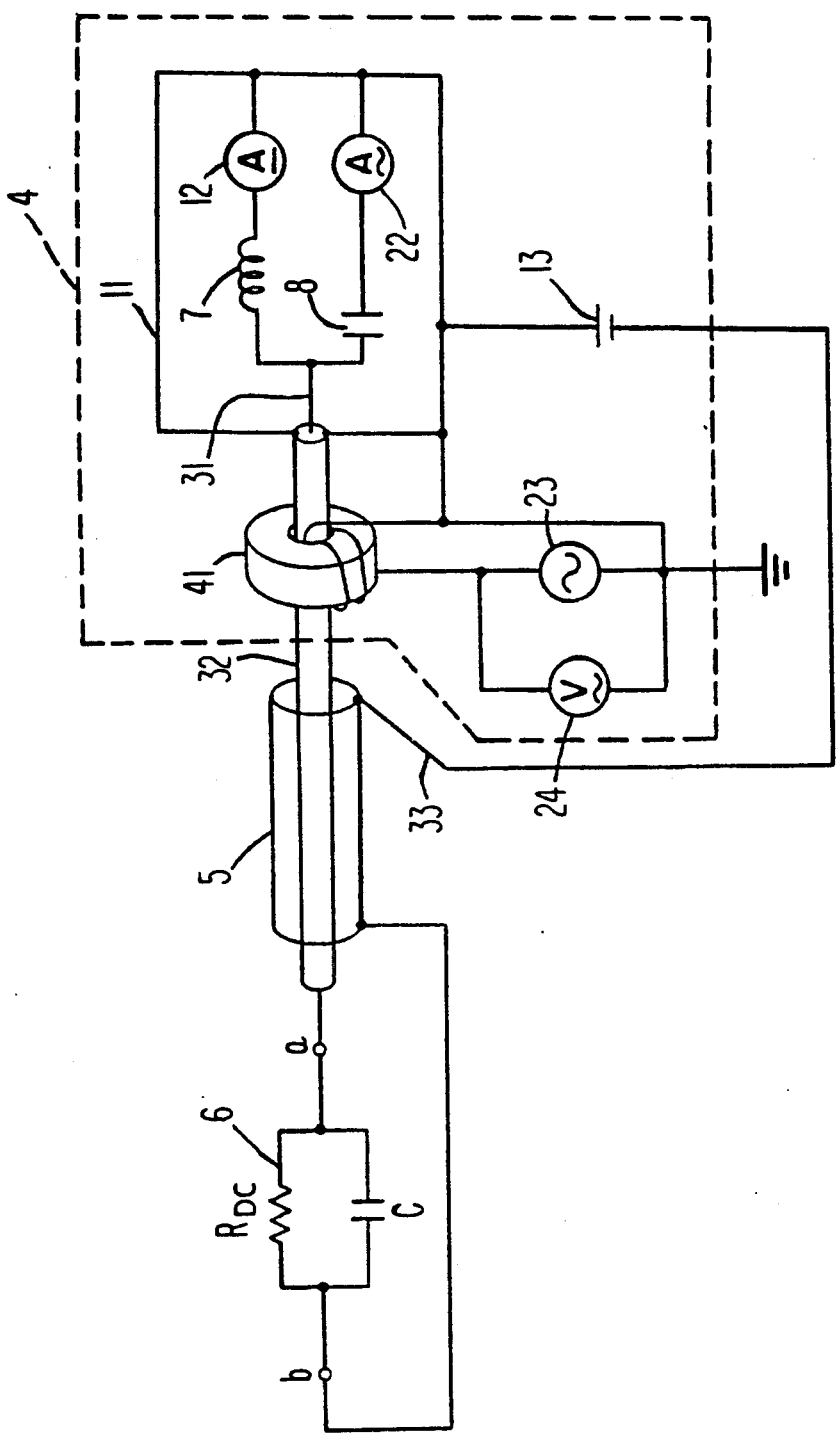
FIG. 8 is a schematic circuit diagram of a fourth alternative embodiment based upon the circuit shown in FIG. 3.

In FIG. 8, one end of the three-wire coaxial cable 5 is connected to a main frame 4 of the measuring apparatus. The other ends of the first conductor 31 and the third conductor 33 of the cable 5 respectively are connected to DUT measuring terminals "a" and "b." In other words, a DUT (indicated by a parallel circuit of capacitor C and an insulation resistor $R_{DC}$) is connected between these DUT measuring terminals "a" and "b." At the other end of the cable 5, ferrite core transformer 41 is disposed over the first and second conductors, 31 and 32 of the three-wire coaxial cable 5. One end of a drive winding wound on this transformer 41 is connected through AC voltage source 23 to ground, and the other end thereof is also connected to ground Unlike an apparatus disclosed in FIG. 4(A), the third conductor 33 of the cable 5 is connected to the voltage source 13. It should be understood that in this embodiment transformer 41 and the AC voltage source 23 constitute the AC voltage signal source according the present invention. By using the transformer 41, the voltage sources 13 and 23 which generate electro-magnetic energy, are mutually separated and grounded. Then, there is little interference between the environment and the tester. The DC voltage source 13 usually includes a high frequency oscillator to generate a high DC voltage. In addition, the parallel connection of current measuring devices 12 and 22 is more desirable than a series connection as the former provides better mutual isolation. The best mode is that cable 32 is wound on the core 41 in three turns and a wire driven by voltage source 13 at 400 Hz is wound on the core for 10 turns.

As previously described, the following are advantages of the present invention:

(1) In particular, the contact check can be positively performed in an automatic inspection process. The insulation resistance check and impedance check for the DUT are executed without the use of an additional cable.

(2) Since the third conductor of the three-wire coaxial cable is grounded in one embodiment, no adverse effect is caused by external electric fields during the insulation check and the impedance measurement. Thus, even when one input line to the DUT is grounded, the insulation resistance check as well as the impedance measurement are performed with high precision. However, in another embodiment, the third conductor is connected to a voltage source. Accordingly, in either embodiment, the precision of the impedance measurement does not deteriorate due to an extension of the cable.

(3) Since the ideal open condition can be realized, (i.e., no leakage current), an increase in capacitance due to the DUT is accurately determined even with an extended cable.

(4) Since low-frequency noise does not affect the DC ammeter in the embodiment having a ferrite core transformer disposed over the first and second conductors, the precision of the insulation resistance check and the contact check are improved. There is no need for an additional circuit for floating a common ground point for a DC current measuring system. Conversely, since no adverse effect over the impedance measuring system is caused by the current path for a measurement of the DC current, there is no deterioration in the precision of the impedance measurement.

It should be noted that the present invention is not limited to the circuit connections shown in FIGS. 3,4, 7 and 8. For instance, a series connection between a DC ammeter and an inductor may be employed as the DC current measuring device. A series connection between a capacitor and an AC ammeter may be employed as the AC current measuring device. In the alternative, these series connection circuits may be connected in parallel to each other and between the first conductor and the second conductor, whereby DC and AC currents are measured. Also, a ferrite core transformer disposed over the first and second conductors may be employed as an AC voltage signal source, and an AC voltage may be applied via this ferrite core transformer across a combination of the first, second conductor or the third conductor. Accordingly, all such modifications are intended to be included within the scope of the invention as defined in the following claims.

What is claimed:

1. a two-terminal circuit element measuring apparatus for performing a contact check function, having measuring circuitry and a three-wire coaxial cable comprising a first conductor as a center conductor thereof, a second conductor for covering said first conductor, and a third conductor for further covering said second conductor, one end of said cable being connected to said circuitry and the other end of said first and third conductors of said cable being connected to an object to be measured, said measuring circuitry comprising:

a DC voltage signal source connected to said first conductor and said third conductor and to said second conductor and said third conductor for applying a DC signal to the object to be measured;

an AC voltage signal source connected to said first conductor and said third conductor and to said second conductor and said third conductor for applying an AC signal to the object to be measured;

an AC voltage measuring device located in said body and being connected between said first conductor and said third conductor and between said second conductor and said third conductor for measuring the AC voltage applied to the object to be measured by said AC voltage signal source;

a DC current measuring device located in said body and being connected between said first conductor and said second conductor for measuring the DC current supplied to the object to be measured by said DC voltage signal source; and, an AC current measuring device located in said body and being connected between said first conductor and second conductor and in series with said DC current measuring device for measuring the AC current supplied to the object to be measured by said AC voltage signal source, whereby a leakage current from said first conductor to said second conductor and to said third conductor is substantially eliminated so as to accurately determine a loose connection between the object to be measured and the two-terminal circuit element measuring apparatus.

2. The two-terminal circuit element measuring apparatus according to claim 1, wherein said third conductor is grounded.

3. The two-terminal circuit element measuring apparatus according to claim 1, wherein said third conductor is grounded.

4. The two-terminal circuit element measuring apparatus according to claim 1, wherein said DC voltage signal source is in series with said AC voltage signal source.

5. The two-terminal circuit element measuring apparatus according to claim 1, wherein said second conductor is grounded.

6. The two-terminal circuit element measuring apparatus according to claim 1, wherein said DC current measuring device and said AC current measuring device are connected in series.

7. The two-terminal circuit element measuring apparatus according to claim 1, wherein said AC voltage measuring device is in series with said DC voltage signal source.

8. The two-terminal circuit element measuring apparatus according to claim 1, wherein said AC voltage measuring device and said AC voltage signal source are in parallel.

9. The two-terminal circuit element measuring apparatus according to claim 1, wherein said DC voltage measuring device further comprises an inductor and a DC ammeter connected in series.

10. The two-terminal circuit element measuring apparatus according to claim 1, wherein said AC voltage measuring device further comprises a capacitor and an AC ammeter connected thereto in series.

11. A method of distinguishing a loose connection between a DUT and a measuring apparatus from a high impedance in the DUT, comprising the steps of:
(a) applying an AC signal to the DUT through a three-wire coaxial cable;
(b) applying a DC signal so as to compensate for a leakage current occurring within the three-wire coaxial;
(c) measuring the AC current flowing through said DUT;
(d) measuring the DC current flowing through said DUT; and (e) determining whether a loose connection between the DUT and the measuring apparatus exists based upon the measurement values taken in Steps (c) and (d) by preventing the measurement of any leakage current while measuring the AC current flow when the measured DC current flow is zero.

12. A two-terminal circuit element measuring apparatus for performing a contact check function, having measuring circuitry and a three-wire coaxial cable comprising of a first conductor as a center conductor thereof, a second conductor for covering said first conductor, and a third conductor for further covering said second conductor, one end of said cable being connected to said circuitry and the other end of said fist and third conductors of said cable being connected to an object to be measured, said measuring apparatus comprising:

a DC voltage signal source located in said body and being connected to said first conductor and said third conductor and to said second conductor and said third conductor, said second pair applying a DC signal to the object to be measured;

an AC voltage source, a ferrite core transformer disposed over the first and second conductors, one terminal of said AC voltage source and one terminal of a drive winding on said ferrite core transformer being connected, the other terminal of said AC voltage source and the other terminal of said driving winding being connected to said third conductor;

an AC voltage measuring device connected between said first conductor and said third conductor and between said second conductor and said third conductor for measuring the AC voltage applied to the object to be measured by said AC voltage signal source;

a DC current measuring device connected between said first conductor and said second conductor for measuring the DC current supplied to the object to be measured by said DC voltage signal source; and, an AC current measuring device located in said body and being connected between said first conductor and second conductor and in series with said DC current measuring device for measuring the AC current supplied to the object to be measured by said AC voltage signal source, whereby a leakage current from said first conductor to said second conductor and to said third conductor is substantially eliminated so as to accurately determine a loose connection between the object to be measured and the two-terminal circuit element measuring apparatus.

13. The two-terminal circuit element measuring apparatus according to claim 12, wherein said third conductor is grounded.

14. An apparatus for distinguishing a loose connection between a DUT and a measuring device from a high impedance in the DUT, comprising:
means for applying an AC signal to the DUT through a three-wire coaxial cable;
means for applying a DC signal so as to compensate for a leakage current occurring within the three-wire coaxial;
means for measuring the AC current flowing through said DUT;
means for measuring the DC current flowing through said DUT; and means for determining whether a loose connection between the DUT and the measuring apparatus exists based upon the measurement values taken by said AC current measuring means and said DC current measuring means for preventing the measurement of any leakage current while measuring the AC current flow when the measured DC current flow is zero.

* * * * *